United States Patent [19]

Ebert, Jr.

[11] 4,227,154
[45] Oct. 7, 1980

[54] FREQUENCY GENERATOR WITH A CONTROLLED LIMIT ON FREQUENCY DEVIATION FROM A SYNCHRONIZING FREQUENCY

[75] Inventor: Harry K. Ebert, Jr., Hackettstown, N.J.

[73] Assignee: Bell Telephone Laboratories, Incorporated, Murray Hill, N.J.

[21] Appl. No.: 953,428

[22] Filed: Oct. 23, 1978

[51] Int. Cl.³ .................................... H03L 7/00
[52] U.S. Cl. ........................... 328/141; 328/72; 328/129; 328/155
[58] Field of Search ............... 328/55, 72, 155, 129, 328/141

[56] References Cited

U.S. PATENT DOCUMENTS

| | | | |
|---|---|---|---|
| 3,601,708 | 8/1971 | Stempler | 328/155 |
| 3,755,748 | 8/1973 | Carlow et al. | 328/72 X |
| 3,766,484 | 10/1973 | Morris et al. | 328/72 X |
| 4,084,127 | 4/1978 | Tults | 328/129 X |
| 4,131,856 | 12/1978 | Chapman | 328/155 |

Primary Examiner—John S. Heyman
Attorney, Agent, or Firm—Joseph P. Kearns; Alfred G. Steinmetz

[57] ABSTRACT

A digital counter driven by a stable high frequency source generates a periodic signal synchronized to an external signal source. Gating circuitry responsive to particular digital counts, accumulated by the counter, defines precise quantized time intervals. The external signal is examined during these quantized time intervals for the occurrence of significant cyclic events such as zero crossing. A single occurrence of cyclic event is determined during a first time interval while successive multiple occurrences of the cyclic event are searched for during a second but smaller time interval. In each instance failure of the event searched for activates corrective circuitry to inhibit synchronous oscillation with the external signal source.

7 Claims, 3 Drawing Figures

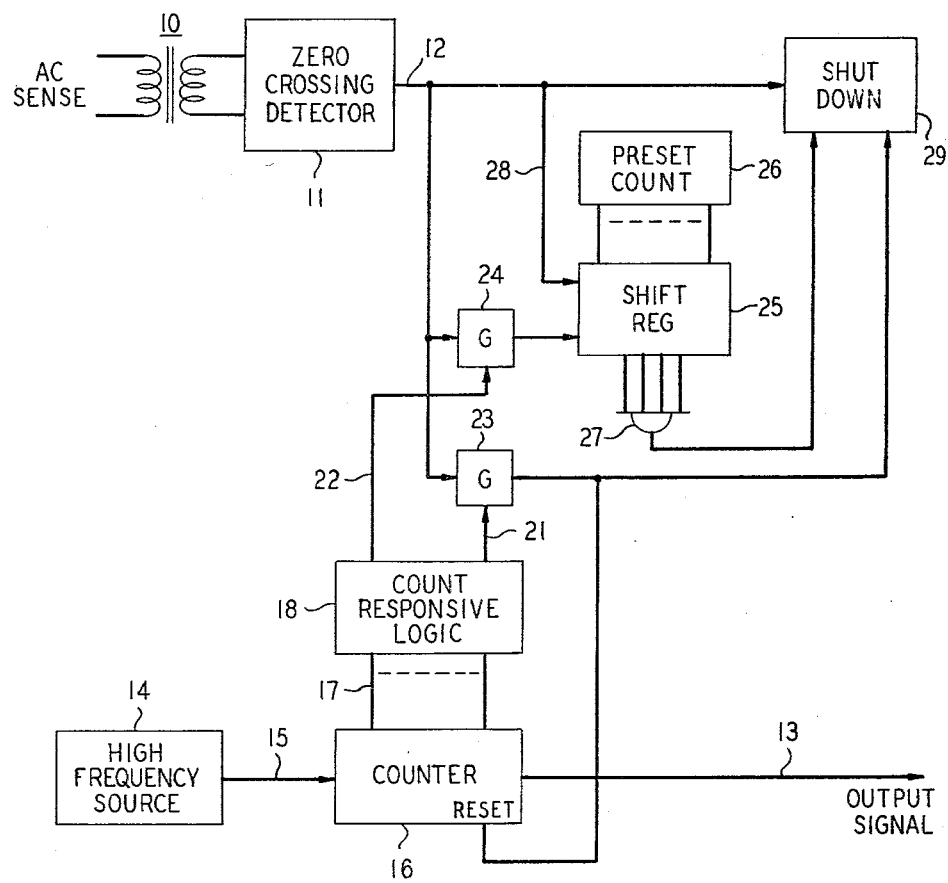

FREQUENCY GENERATOR WITH A CONTROLLED LIMIT ON FREQUENCY DEVIATION FROM A SYNCHRONIZING FREQUENCY

TECHNICAL FIELD

This invention is concerned with signal frequency monitoring, and more particularly, with a synchronized signal source having frequency monitoring circuitry responding to frequency deviation of the master synchronizing signal beyond preset limits.

BACKGROUND OF THE INVENTION

It is often desirable in many power supply circuits, such as uninterruptible power supplies, to have two independent signal sources cooperate with each other. In the case of uninterruptible power supplies, it is desirable that the frequency of the auxiliary, or reserve, signal source be synchronized with the primary signal source. In many instances the primary signal source is a commercial AC signal and the auxiliary, or reserve, signal source is an inverter driven by an independent, high frequency and highly stable oscillatory source which is divided to a frequency equaling that of the primary AC signal source. It is necessary that the signals from both the primary and reserve sources operate at the coordinated signal frequencies in a controlled relationship with each other in order to avoid undesirable signal transients.

Since the high frequency signal source is normally more frequency stable than the normal commercially supplied primary AC signal, it is desirable to determine if the frequency of the primary AC signal deviates from a desired standard. A prior art method of making such frequency comparisons has been to utilize the zero crossings of the primary AC signal to activate a counter to count the pulse output of the high frequency oscillator within a time duration limit established by successive zero crossings of the primary AC signal. At the end of the half-cycle of the primary AC signal, the count of the counter is compared with predetermined count limits. If the count is less than or exceeds the limits established, alarm circuitry is energized to institute corrective action.

This particular prior art frequency comparison arrangement has limitations. For example, only a single limit for any one cycle may be defined. If a narrow limit is selected it may be too sensitive to temporary deviations. A wide limit, however, may be too insensitive in that it permits a continuous deviation which is undesirable but is insufficient to activate the alarm circuitry.

SUMMARY OF THE INVENTION

Therefore, in accord with the principles of the invention, a high frequency signal source, which may be used as a signal drive for an auxiliary power source in an uninterruptible power supply, has its signal frequency divided to the same frequency as the frequency of the primary AC signal power source. This output signal is to be kept in synchronism with the primary AC power signal.

The permutated counts of the counter used to divide the high frequency signal source are coupled to logic circuits in order to monitor the count permutations, which are utilized to define selected windows. During these window durations selected periodic occurrences of the AC signal, such as a zero crossing, are searched for. Windows of both large and small duration are simultaneously defined. During a large window duration a zero crossing is searched for in every cycle of operation. A smaller duration window is defined and a single zero crossing of the primary AC signal is searched for during several sequential cycles. The occurrence of a single zero crossing within a predetermined number of sequential cycles ensures continued operation of the circuit.

In a particular circuit arrangement embodied according to these principles, a digital counter driven by a stable high frequency source generates a periodic signal synchronized to an external signal source. Logic circuitry responsive to particular permutations of the digital count accumulated by the counter defines precise quantized time intervals or windows. The external power signal is examined during these quantized time intervals for the occurrence of significant cyclic events such as a zero crossing. A single occurrence of a cyclic event is determined during a first single time interval while the cyclic event is searched for during successive occurrences of a second but smaller time interval. In each instance failure of the event searched for activates corrective circuitry to inhibit synchronous oscillation with the external power signal.

BRIEF DESCRIPTION OF THE DRAWING

An understanding of the invention may be obtained by reference to the following detailed description describing an embodiment of a frequency synchronizing system for a primary and auxiliary power source embodying the principles of the invention and the accompanying drawings in which:

FIG. 1 is a block diagram of a frequency deviation detector embodying the principles of the invention;

FIG. 2 discloses a count sequence table to assist in the understanding of the frequency deviation detector.

DETAILED DESCRIPTION

Figure 3:
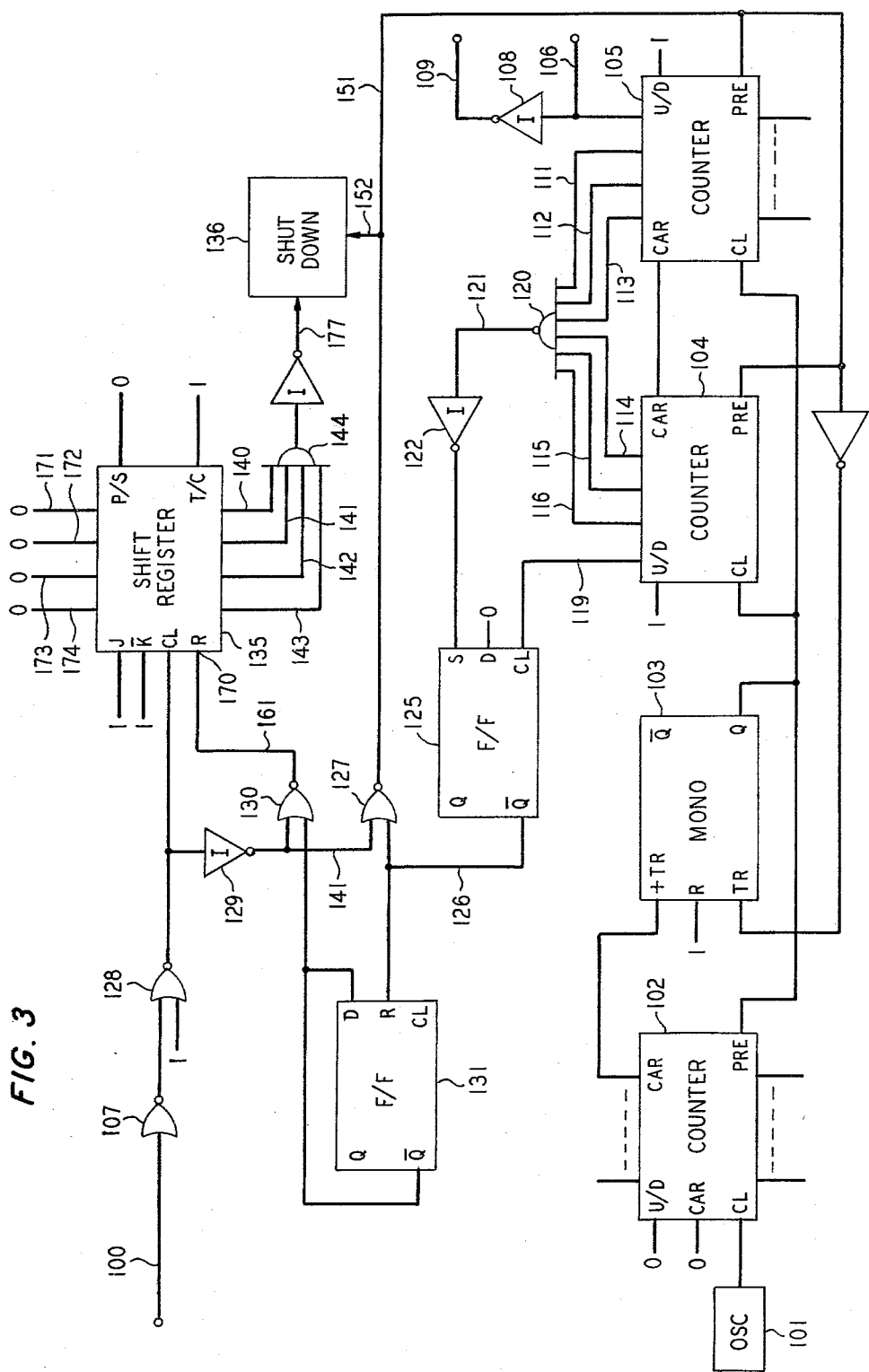
FIG. 3 is a detailed logic diagram of an operative frequency deviation detector embodying the principles of the invention.

A frequency deviation detector to permit the synchronization of a primary AC signal source and an auxiliary signal source is disclosed in FIG. 1. As shown therein, a primary AC signal is applied to a sensing transformer 10 and coupled to a zero crossing detector 11. Zero crossing detectors are well known in the art and hence the circuitry thereof is not disclosed herein. The zero crossing detector 11 responds to a zero crossing of the AC signal and generates a pulse signal output on lead 12. This pulse, responsive to the zero crossing of the AC signal, is utilized as described below to determine synchronism of the AC signal and the output signal on lead 13 derived from the high frequency source 14.

A digital counter 16 counts the high frequency signals and a divided output at its highest order bit output lead 13 having a frequency identical to the primary AC signal. This signal is the desired auxiliary signal. The next succeeding lower order bit output leads 17 of the counter 16 are coupled to a logic circuit 18 designed to respond to particular count digit permutations of the count appearing on output leads 17. The logic control 18 responds to these count digit permutations of the counter 18 in order to define two distinct time duration windows during which zero crossings of the primary AC signal are searched for.

The count responsive logic circuit 18 establishes a first window of substantial duration during which a zero crossing pulse is searched for during each cycle of operation. It also defines a short duration window during which a zero crossing is looked for to occur at least once during a defined succession of short duration windows. The long duration window during which the first gate 23 is enabled by an enabling signal on lead 21 allows the zero crossing pulse to be applied to the reset input of the digital counter 16 and hence permits continued synchronized operation of the two signal sources. The zero crossing pulse appearing is further utilized to disable operation of a shutdown circuit 29 which operatively responds to an absence of the zero crossing pulse to terminate synchronous operation within the power supply. Since this shutdown circuit 29 is concerned with response to nonoccurrence of zero crossing pulses within a defined window and not with the detection of the absence of synchronization, it is not believed necessary to disclose it. Shutdown circuit 29 is also responsive to the nonoccurrence of zero crossing pulses within a succession of shorter time intervals as discussed herein below.

A second gate 24 is enabled to transmit zero crossing pulses by an enabling signal supplied by the count responsive logic 18 on lead 22 during the short duration window. This enables the zero crossing pulse, if it occurs during this short duration window, to be applied to the reset input of a shift register 25. The zero crossing pulse is also applied via lead 28 to the clock input of shift register 25. This input shifts the count contained in register 25 if it is not periodically reset to a preset count.

Shift register 25 is periodically loaded with a preset count supplied by the preset count source 26 every time it is reset. This preset count is applied to AND gate 27 at the output of the shift register 25 and comprises preselected ZEROS to disable transmission therethrough. The register 25 is operative to replace all ZEROS shifted by ONES as the bit location of the ZERO is vacated. If the register 25 is not reset by a zero crossing pulse for four successive short windows, the preset count is shifted out of register 25 by a series of zero crossing pulses applied via lead 28, and the eventual count applied to AND gate 27 comprises all ONES and enables an output to the shutdown circuit 29. Hence, during one of the short duration windows within a defined succession of windows, the shift register must be reset by a zero crossing pulse or the shutdown circuit 29 will be activated.

If the zero crossing does not occur, the zero crossing pulse on lead 19 clocks the shift register 25 so that the preset count may be serially cycled out thereby allowing the shift register output to enable the AND gate 27 and, hence, activate the shutdown circuit 29.

As is apparent from the foregoing description, the count permutations of the count in the counter 16 define long and short windows during which zero crossings of the AC signal are looked for. A count responsive logic circuit 18 enables transmission of a zero crossing pulse during the long window to reset the counter and to inform the shutdown circuit. This same logic circuit enables transmission of a zero crossing pulse to reset a shift register 25 during the short window.

A detailed logic block diagram of the frequency deviation detector is shown in FIG. 3. This frequency deviation detector comprises standard D-type flip-flops, AND gates, OR gates, NAND gates, NOR gates, inverters, digital counters, and shift registers. These particular logic components are shown in FIG. 3 in their typical schematic designations. Inasmuch as many of these logic circuits fail to operate properly, if any of their unused inputs are left in an indeterminate state, ONES and ZEROS have been shown applied to otherwise unconnected inputs to assure predictable operation of the circuits. These ONES and ZEROS may be generated by any suitable signal source which can generate the appropriate signal state levels and hence is not schematically shown. However, it is understood that the specific logic arrangement shown herein is only one illustrative arrangement of the principles of the invention and that the scope of the invention is not limited to this particular logic arrangement.

The auxiliary power signal which is to be synchronized with the primary AC signal source is generated in response to a high frequency, crystal oscillator 101 which, in the illustrative embodiment, generates a signal of 214 kH. While a crystal oscillator has been found to be desirable in this circuit, other stable high frequency oscillators may be used equally well.

The high frequency output of the crystal oscillator 101 is applied to a first digital counter circuit 102 which counts down the signal to a lower intermediate frequency. A monostable circuit 103 further divides the output of the first digital counter 102 to a lower intermediate frequency which is applied to another digital counter array comprising two sequentially connected digital counters 104 and 105. This second digital counter arrangement completes the countdown of the high frequency signal and produces at its higher order bit output lead 106 a square wave signal which is approximately the same frequency as the primary AC signal frequency. Its inverted polarity complement signal on lead 109 is generated by use of inverter 108.

As discussed above, zero crossings of the AC primary power signal are determined and a simultaneous pulse is generated in response thereto. This zero crossing pulse is applied via lead 100 to a NOR gate 107 of the frequency deviation detector. The output of NOR gate 107 is coupled to NOR gate 128 whose output in turn is coupled via a polarity inverter 129 to NOR gates 127 and 130. This sequence of gating circuits is utilized in part to assure the necessary signal polarity to operate other logic circuit components. Inasmuch as these requirements are a matter of design and logic circuit selection, the signal polarity requirements of the circuit are not discussed herein.

The next succeeding lower order bit outputs 111–116 of counters 104 and 105 are coupled to count digit permutation responsive logic circuitry, which includes a coincidence gate 120 and two D-type flip-flops 121 and 122. This logic circuitry in response to count digit permutations periodically defines time intervals or windows. During the time interval or window established by particular count digit permutations gating circuitry is enabled to transmit zero crossing pulses responsive to zero crossings of the AC signal. If these pulses occur during the window, they are transmitted and are utilized to disable subsequent shutdown circuitry which is synchronized with the primary AC signal to disable circuitry if certain input signals are not achieved during windows.

The critical digital count permutations during which the windows are established are partially shown in the count state diagram of FIG. 2 wherein selected digit permutations of the count at about the half-cycle state n/2 and states (n-x)/2 just prior thereto are shown. The various selected successive counts shown in FIG. 2 are numbered in decreasing order from n/2 at the half-cycle, to (n−1)/2, (n−2)/2, et cetera. The various states of the bit locations are utilized to selectively activate logic circuitry in such a fashion as to define both a wide and narrow window during which a zero crossing is searched for. As is evident from the count permutations shown in FIG. 2, the uniqueness of each count can be used to control logic circuitry to precisely define windows which are time related to the zero crossings of the primary AC signal. As is indicated, a particular count is utilized to activate an AND gate at a unique period of time in the generation of the secondary signal to initiate a window duration. In this arrangement a first window is established during which a zero crossing is looked for during every half-cycle. A second narrower window is established during which a zero crossing occurrence is looked for at least once within several sequential cycles of operation.

Just observing the count sequence in FIG. 2 of the six lower order bits A2–A7 next to the highest order bit A1, it is evident that an unbroken series of high states designated by ONES are generated at a time stage (n−2)/2 shortly before the half-cycle time n/2 and a succession of these ONES is utilized to enable a coincidence gate 120. The succession of ONE digits or bits as the count gets closer to the half-cycle mark increases so that the succeeding ONE bits, such as A8, may be utilized to operate further logic circuitry to define a second narrower window after the coincidence gate responsive to a prior count is enabled.

As is apparent from FIG. 3, the next six succeeding lower order bits on leads 111–116 from the highest order bit on lead 106 are applied to coincidence gate 120. At a particular count (n−2)/2 shortly prior to the half-cycle mark, all ONE bits are applied to the coincidence gate. It is apparent from FIG. 2 that the coincidence gate is enabled at the −1/32 time mark and the coincidence gate 120 generates a signal at its output lead 121 in response to the continuous series of six ONES preceding the highest order bit of the count output.

The output of the AND gate 120 is coupled via a polarity inverter 122 to the set input of a D-type flip-flop 125. Since the D-type flip-flop 125 operates asynchronously in response to a signal applied to a set input, its complementary output on lead 126 immediately goes low in response thereto. This complementary output signal on lead 126 is applied to a NOR gate 127. NOR gate 127, which is coupled to transmit the zero crossing pulse, is thereby enabled to transmit a zero crossing pulse on lead 141 if it occurs within the window during which the NOR gate 127 is enabled. If the zero crossing pulse occurs during the window, it is transmitted via the NOR gate 127 and is applied via lead 151 to reset the digital counters 102, 103, and 105 to assure continued synchronism of the primary and secondary signals. Hence, it is apparent that if the zero crossing occurs within the window indicating satisfactory synchronization, the digital counters are reset so that the divided output of the crystal oscillator is maintained in synchronism with the primary AC signal.

This zero crossing pulse is also applied via lead 152 to the shutdown circuit 136. The shutdown circuit may comprise any pulse signal responsive circuitry synchronized to the primary DC signal operative to shut down other circuitry if a desired synchronism indicated by its input signals is lost. A zero crossing pulse input on lead 152 disables the shutdown circuit from its shutdown operation.

The complementary output of the first D-type flip-flop 125 is also applied to the reset input of the second D-type flip-flop 131. Since the complementary output of the first reset D-type flip-flop is high, the second D-type flip-flop 131 is immediately asynchronously reset into its reset state. With the second D-type flip-flop 131 in its reset state, a lower order bit on lead 119 lower than that applied to the AND gate is applied to the clocking input of the second D-type flip-flop 131. Since the reset complementary output of D-type flip-flop 131 is coupled into its D input, the clocking pulse triggers the D-type flip-flop into its set state producing a low output state at its complementary output.

From the count diagram of FIG. 2, it is apparent that the second D-type flip-flop 131 is clocked by the digit in the A8 position at the −1/64 mark at which time the second narrow window duration is commenced. The complementary output of the second D-type flip-flop 131 is at its low output state and is utilized to enable a second NOR gate 130 which transmits the zero crossing pulse occurring on lead 141. This zero crossing pulse is applied via lead 161 to the reset input of a J–K shift register 135 which responds to an absence of at least a single zero crossing pulse during a succession of short duration windows as discussed below.

The zero crossing pulse is transmitted by the NOR gate 128 to the clock input of a J–K set shift register 135 which is operated in its serial mode. This clock pulse steps the output in the J–K mode. A fixed input count 0000 supplied thereto on input leads 171–174 is reset into the register 135 when a zero crossing pulse is applied to its reset input 170 during the narrow window interval via enabled NOR gate 130. If no reset signal is applied for a period of four successive cycles, the preset count is clocked to a 1111 count of the shift register 135 on leads 140–143. This 1111 is applied to an AND gate 144 which is thereby enabled to transmit a signal via lead 177 to a shutdown circuit 136. This signal activates the shutdown function of circuit 136.

After the shift register 135 is reset as above described, and as the half-cycle digital count is commutated in the counter, flip-flop 125 is clocked and its complementary output goes low. A low signal at the complementary output disables the NOR gate 127 and terminates the long window. If no zero crossing pulse has occurred, the digital counter is not reset and the absence of a pulse on lead 152 allows the shutdown circuit to operate. The resulting high input to the reset of the second D-type flip-flop 131 resets it and its complementary output goes high. This disables the NOR gate and prevents the resetting of the shift register 135 because the zero crossing pulse has not occurred within the window.

As is apparent from the count diagram in FIG. 2, the first window is established to encompass ±1/32 of the total cycle duration and the second window is within a ±1/64 fractional duration of the cycle. While these particular windows have been established, it is apparent to those familiar with digital circuitry that many various other windows may be established which are factors of two by utilizing solely the accumulating digital count of a digital counter.

I claim:

1. A frequency deviation detector for monitoring synchronism of a first and second periodic signal, comprising dividing means for accepting a high frequency signal source and deriving a first periodic signal;

logic means for responding to preselected count states of said dividing means, said logic means including a coincidence gate responsive to a sequence of count digits less than a highest and more than a lowest order digit contained within said dividing means gating means for accepting zero crossing signals responsive to said second periodic signal and responsive to said logic means to enable transmission of a zero crossing signal during time intervals defined by the preselected count states, said gating means including a first transmission gate responsive to an output of said coincidence gate and coupled to transmit zero crossing signals.

2. A deviation detector as defined in claim 1 wherein said logic means further includes a shift register having a clock input responsive to zero crossing signals applied to said gating means, and means for resetting said shift register in response to said coincidence gate and output means responsive to said shift register if it remains unreset within a sequence of time intervals.

3. A frequency deviation detector comprising
means for accepting zero crossing signals related to a first signal,
means for counting down a high frequency signal to a frequency approximately equal to the frequency of the first signal,
logic means for responding to preselected counts contained in said means for counting down, and
gating means responsive to said logic means for transmitting the zero crossing signals of said means for accepting; said logic means including count permutation response means to establish a first and second time window and said gating means including first and second signal transmission gates coupled to said means for accepting and responsive to said count permutation responsive means to enable transmission during the first and second time windows.

4. A frequency deviation detector as defined in claim 3 further including a preset shift register having a reset input responsive to zero crossing signals transmitted by the second transmission gate and having a clock input responsive to zero crossing signals during each cycle and an output circuit responsive to the shifting of the preset count out of the shift register.

5. A frequency deviation detector to respond to drift in frequency between an external periodic signal and a second periodic signal, a high frequency oscillator source and digital counting means to divide an output of the high frequency oscillator to generate the second periodic signal, said frequency deviation detector comprising:
count identification means responsive to particular counts of the accumulating count of the digital counting means, timing means responsive to the count identification means for quantizing a time interval, gating means coupled for receiving a periodic cyclic event signal of said external periodic signal and responsive to said timing means to transmit the periodic cyclic event signal if it occurs within a quantized time interval.

6. A frequency deviation detector as defined in claim 5 and further including second timing means for quantizing a second time interval, and second gating means coupled for receiving a periodic cyclic event signal of said external periodic signal and responsive to said timing means to transmit the periodic cyclic event signal if it occurs within a second quantized time interval, and means coupled to an output of said second gating means for responding to an absence of the periodic cyclic event for at least a predetermined number of successive cycles of operation.

7. A frequency deviation detector comprising
gating means including an input to accept zero crossing signals of a first periodic signal at a first frequency,
counting means to count down a second periodic signal at a second frequency to a signal at the first frequency; and
control circuit responsive to count permutations of said counting means and operative to enable transmission in said gating means for selected time intervals determined by occurrences of the count permutations, said control circuitry including a coincidence gate coupled to respond to a selected sequence of digits below a highest order digit to establish a first selected time interval and a flip-flop operative in combination with the coincidence gate to establish a second selected time interval and means for responding to a failure to receive a zero crossing pulse through said gating means during a fixed succession of said second selected time intervals.

* * * * *